(12) United States Patent
Colwell et al.

(10) Patent No.: US 9,990,461 B1
(45) Date of Patent: Jun. 5, 2018

(54) METHOD AND APPARATUS FOR PLACEMENT AND ROUTING OF ANALOG COMPONENTS

(71) Applicant: Cadence Design Systems, Inc., San Jose, CA (US)

(72) Inventors: Regis Colwell, Gibsonia, PA (US);
Patrick Hyde, Austin, TX (US);
Akshat Shah, Alexandria, VA (US);
Jeremiah Cessna, Pittsburgh, PA (US);
Timothy Rosek, Gibsonia, PA (US);
Khaled Elgalaind, Pittsburgh, PA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days. days.

(21) Appl. No.: 15/282,632

(22) Filed: Sep. 30, 2016

(51) Int. Cl.
*G06F 17/50* (2006.01)

(52) U.S. Cl.
CPC ...... *G06F 17/5081* (2013.01); *G06F 17/5072* (2013.01); *G06F 17/5077* (2013.01)

(58) Field of Classification Search
CPC .......................... G06F 17/5072; G06F 17/5077
USPC .......................... 716/110, 111, 112, 119, 126
See application file for complete search history.

(56) References Cited

U.S. PATENT DOCUMENTS

| 5,173,933 A | * | 12/1992 | Jabs et al. | .......... H04B 7/18563 |
| | | | | 379/111 |
| 5,956,396 A | * | 9/1999 | Ash et al. | ............ H04Q 3/0016 |
| | | | | 379/220.01 |

* cited by examiner

*Primary Examiner* — Sun Lin
(74) *Attorney, Agent, or Firm* — McDermott Will & Emery LLP

(57) ABSTRACT

A method for placing and routing devices in a circuit layout is provided. The method includes determining devices to be placed in a circuit layout and a relative position of two devices in the circuit layout. In some embodiments, the method includes pre-routing channels in the circuit layout, determining routing trunk information from the pre-routed channels, and placing the two devices in the circuit layout based on the routing trunk information. Further, the method includes forming a first routing trunk along channels in the circuit layout, coupling the first routing trunk to one device of the two devices, and checking that a placement of a plurality of devices and the coupling the first routing trunk to one device of the plurality of devices meet a circuit layout specification. A computer system and a non-transitory computer-readable medium storing commands to execute the above method are also provided.

20 Claims, 6 Drawing Sheets

US 9,990,461 B1

METHOD AND APPARATUS FOR PLACEMENT AND ROUTING OF ANALOG COMPONENTS

TECHNICAL FIELD

Embodiments described herein are generally related to the field of circuit design and more particularly to circuit design tools that comply with performance specifications for advanced node circuit design applications.

BACKGROUND

In traditional circuit design tools, iteration cycles of a circuit design to comply with performance specifications occur at multiple points during the design flow. As the number of devices and components included in a circuit layout increases while their size reduces, increased current densities create deleterious effects that become more difficult to predict and tackle during the iteration cycles. As a result, the number and complexity of the iteration cycles in traditional design tools rapidly increases. In addition, the results of the iteration cycles become less predictable and more sensitive to minor details in the circuit layout design. Accordingly, traditional design tools become prone to error or time-consuming, requiring constant user attention and follow up at multiple stages.

The description provided in the background section should not be assumed to be prior art merely because it is mentioned in or associated with the background section. The background section may include information that describes one or more aspects of the subject technology.

SUMMARY

In a first embodiment, a computer-implemented method for placing and routing devices in a circuit layout is described. The computer-implemented method includes determining two devices to be placed in a circuit layout and determining a relative position of the two devices in the circuit layout. In some embodiments, the computer-implemented method further includes routing a plurality of channels along a pre-routing location in the circuit layout based on the relative position of the two devices, determining routing trunk information from the pre-routing location of the plurality of channels, and placing the two devices in the circuit layout based on the routing trunk information. Further in some embodiments, the computer-implemented method includes forming a first routing trunk along the pre-routing location of at least one of the plurality of channels, coupling the first routing trunk to one of the two devices, and checking that a placement of the plurality of devices and the coupling the first routing trunk to at least one of the plurality of devices meet a circuit layout specification.

In a second embodiment, a system is described that includes a memory storing computer code, and a processor that executes the computer code. When executing the computer code, the processor is configured to determine two devices to be placed in a circuit layout, determine a relative position of the two devices in the circuit layout, and route a plurality of channels along a pre-routing location in the circuit layout based on the relative position of the two devices. The processor is also configured to determine routing trunk information from the pre-routing location of the plurality of channels, place the two devices in the circuit layout based on the routing trunk information, form a first routing trunk along the pre-routing location of at least one of the plurality of channels, couple the first routing trunk to one of the two devices, check that the two devices and the first routing trunk meet a circuit layout specification, and select a form and a location of an empty area in the circuit layout.

In yet another embodiment, a non-transitory, machine-readable storage medium is described that includes machine-readable instructions for causing a processor to execute a method for placing and routing devices in a circuit layout. The method includes determining two devices to be placed in a circuit layout, determining a relative position of two devices in the circuit layout, routing a plurality of channels along a pre-routing location in the circuit layout based on the relative position of the two devices, and determining routing trunk information from the pre-routing location of the plurality of channels. Further, in some embodiments the method includes placing the two devices in the circuit layout based on the routing trunk information, forming a first routing trunk along the pre-routing location of at least one of the plurality of channels, coupling the first routing trunk to one of the two devices, checking that the two devices and the first routing trunk meet a circuit layout specification, and selecting a form and a location of an empty area in the circuit layout.

Further, in some embodiments, a system is described for placing and routing devices in a circuit layout. The system includes a means for determining two devices to be placed in a circuit layout, for determining a relative position of the two devices in the circuit layout, for routing a plurality of channels along a pre-routing location in the circuit layout based on the relative position of the two devices, and for determining a routing trunk information from the pre-routing location of the plurality of channels. The system also includes a means for placing the two devices in the circuit layout based on the routing trunk information, for forming a first routing trunk along the pre-routing location of at least one of the plurality of channels, for coupling the first routing trunk to one of the two devices, and for checking that the two devices and the first routing trunk meet a circuit layout specification.

BRIEF DESCRIPTION OF THE DRAWINGS

In the figures, elements and steps denoted by the same or similar reference numerals are associated with the same or similar elements and steps, unless indicated otherwise.

DETAILED DESCRIPTION

Figure 1:
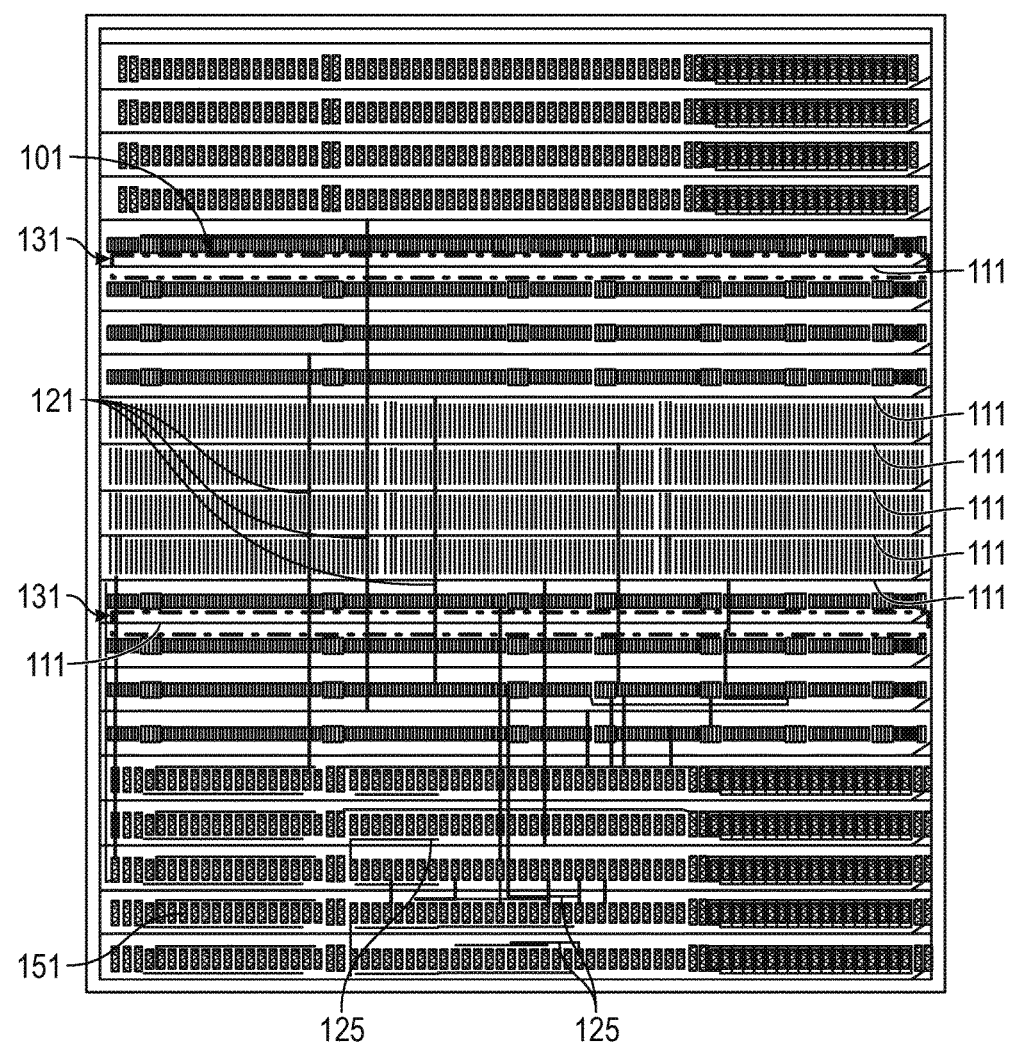
FIG. 1 illustrates a circuit layout provided by a design tool, according to some embodiments.

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed system provides a method for placing and routing devices in a circuit layout by using a pre-routing step to check that a relative positioning of the devices and channel trunks complies with a circuit layout specification. When the pre-routing scheme meets the circuit layout specification, the circuit layout composition continues until the desired devices are placed in the circuit layout. The routing is broken into two steps: creating the main portion of routing in the channel (the trunks) and connecting these trunks to the devices.

Circuit designers perform many different steps to design functional circuits on a chip. For example, appropriate circuit components and devices with the correct electronic parameters are determined. The components and devices may be placed in a circuit layout that leaves adequate interconnect space between them. Also, interconnect routing is created with desired couplings to devices and components and with selected wire widths so that the circuit performs as desired. Some embodiments include a final simulation of the resulting circuit layout, ensuring that the physical implementation of the circuit matches the desired specification and performance, even when effects that typically appear in the completed circuit layout are included.

Embodiments consistent with the present disclosure include a place and route flow wherein the placement and routing of different components in a circuit layout is decomposed into smaller sub-units. Optimization of the circuit layout configuration in the smaller subunits substantially reduces the number of iteration steps wherein form (e.g., size and shape) and location of the different components in the complete circuit layout are modified to obtain the desired performance. Accordingly, embodiments as disclosed herein include a reduced number of repeated placement and routing steps until the design specifications are met. Reducing the repeated checking of design specifications is desirable in view of the high computational cost of placement and routing steps.

Embodiments consistent with the present disclosure resolve the problem of properly placing devices in the circuit layout without an a-priori knowledge of the form and location of empty areas. Empty areas between components in the circuit layout create space for connector routings between circuit components. Smaller and fewer empty areas increase congestion in the circuit layout. Under these circumstances, a traditional routing tool or engine may not be able to successfully complete before an error message and a warning is issued. When more space than desirable is left in the circuit layout, the circuit may be considered suboptimal or may violate design rules that include density of certain materials. Further effects in conventional advanced process nodes in electronic circuitry may cause the amount of space desired for routing to be impacted by the placement of devices near routing connectors. Traditional design tools fail to consider these effects. Therefore, users of traditional design tools rely on costly iteration of placement configuration in the circuit layout to ensure that routers have no impact in the placement.

The shortcomings of traditional design tools become more evident with the development of low dimensional circuit features having dimensions generally below 20 nm (e.g., 'advance node' technology). For these applications, slight adjustments in the final device layout (e.g., placement and routing) may cause dramatic swings in design integrity and device performance.

As the complexity and versatility of design tools increases, (e.g., as desired for advanced node technology) it becomes easier for a user to automate design steps as design tools are more regular and give less opportunity to the user for manual intervention, compared to legacy nodes (e.g., those having dimensions greater than 20 nm or using planar transistors instead of finfet). Design tools as disclosed herein provide reliable advanced node designs that reduce supervision steps for the user.

In some embodiments, advanced node design tools consider physical effects typically exacerbated in reduced dimensional electronics. Electromigration (EM) is the degenerative displacement of material in a conducting or semiconducting channel (e.g., heavy ions in a semiconductor lattice) due to the continuous impact of a highly dense charge carrier flow through a portion of the conducting or semiconducting channel (e.g., 'wire'). Thus, electromigration effects are more noticeable when the dimensions of the conducting or semiconducting channel are reduced, thereby increasing the current density (all other factors being substantially equal). Self-heating effects (SHE), as their name indicates, are the result of a temperature rise in the conducting or semiconducting channel, produced chiefly by the current flow through the channel itself. The electrical characteristics of wires change as the temperature of that wire changes. These effects are enhanced in advanced node design tools because the wires and components are smaller, which makes them more susceptible to the effect (increased heat dissipation due to a higher current density). Secondly, dimensionally reduced circuit components, such as fin-field effect transistors (finfets) commonly used in advanced node design tools, allow more power to be consumed in less space. This means that wires in advanced node design tools tend to operate at higher temperatures than traditional planar transistors such as field-effect-transistors (FETs), metal-oxide-semiconductor FETs (MOSFETs), and the like. Accordingly, the proximity between the placed devices and between the conducting channels in advanced node design tools becomes a critical factor. Some embodiments as disclosed herein incorporate heat sink structures in the circuit layout of advanced node design tools to mitigate the deleterious effects of EM and SHE.

Other considerations such as the amount of current can also impact the effective width of the wires and are dependent on how the devices are connected (which is directly related to how the devices are placed in the circuit layout). Some embodiments allow a wire to handle more (or less) current by simply changing the width of the wire to suit the desired current. Some embodiments pay special attention to the manufacturability of the electronic circuit, such as in advanced node processes. In such circumstances, the design tool may include rules that prohibit simple widening of the wires, to increase current flow. Accordingly, some embodiments include alternative methods to increase current flow. Some of these alternative methods include running multiple wires on the same layer or adjacent layers to handle extra current. Widening a circuit connector in this manner increases the complexity of a manual approach to the design tool, and complicates SHE even further.

Considerations affecting circuit layout (e.g., EM and SHE) are more prominent for advanced node design tools. In traditional design tools, experienced circuit layout designers may follow simple conventions to avoid such problems as EM and SHE. When iterating between design tools the same basic process is used with even more discrete steps. Automation in traditional design tools may reduce the overall time to create a circuit layout that meets specifications but the iteration cycles are still time consuming. There are variations on this flow where parts of routing can be considered during placement (such as Modgen pin to trunk routing in some design tools). Such routing is again following a heuristic approach and is just as susceptible to ultimately not meeting specifications.

In some embodiments, design tools as provided herein decompose placement and routing steps into smaller portions of the circuit layout that may be combined to form a more integrated design flow. With the new, smaller steps, embodiments of the present disclosure introduce places where partial placement information can be used to make routing decisions and pre-routing information can be used to impact placement, before finalizing a circuit layout.

FIG. 1 illustrates a circuit layout 100, according to some embodiments. Circuit layout 100 includes areas for placing devices 101, and routing trunks 111 for electrically coupling devices 101. Routing trunks 111 are disposed within channels 131, which are empty spaces between devices 101, used for routing. In some embodiments, circuit layout 100 may include extra routing lines 121 across different rows of devices 101 and channels 131. Twig routing 125 may be connecting routing trunks 111 to devices 101. Devices 101, routing trunks 111, routing lines 121, twig routings 125, and channels 131 in circuit layout 100 may be placed and routed using design tools as disclosed herein. In addition, circuit layout 100 may include a heat sink structure 151 made of a material or combination thereof having a high heat conductivity. Circuit layout 100 may also include an area of the chip which is not consuming as much power as the active circuit. In some embodiments, heat sink structures 151 may be determined by design, according to a thermal management configuration of circuit layout 100, or to a performance specification for the circuit such as a material density distribution for fabrication purposes. For example, in some embodiments heat sink structures 151 may include dummy devices disposed on the circuit layout to satisfy the material density distribution in the circuit design. The material density distribution may include a material density gradient condition established by certain manufacturing desirability, such as to maintain an homogenous light contrast in photolithography for the entire circuit layout. In some embodiments, material density ranges or material density gradient ranges may be incorporated as a circuit layout specification to be met for placing and routing configurations as disclosed herein.

Figure 2A:
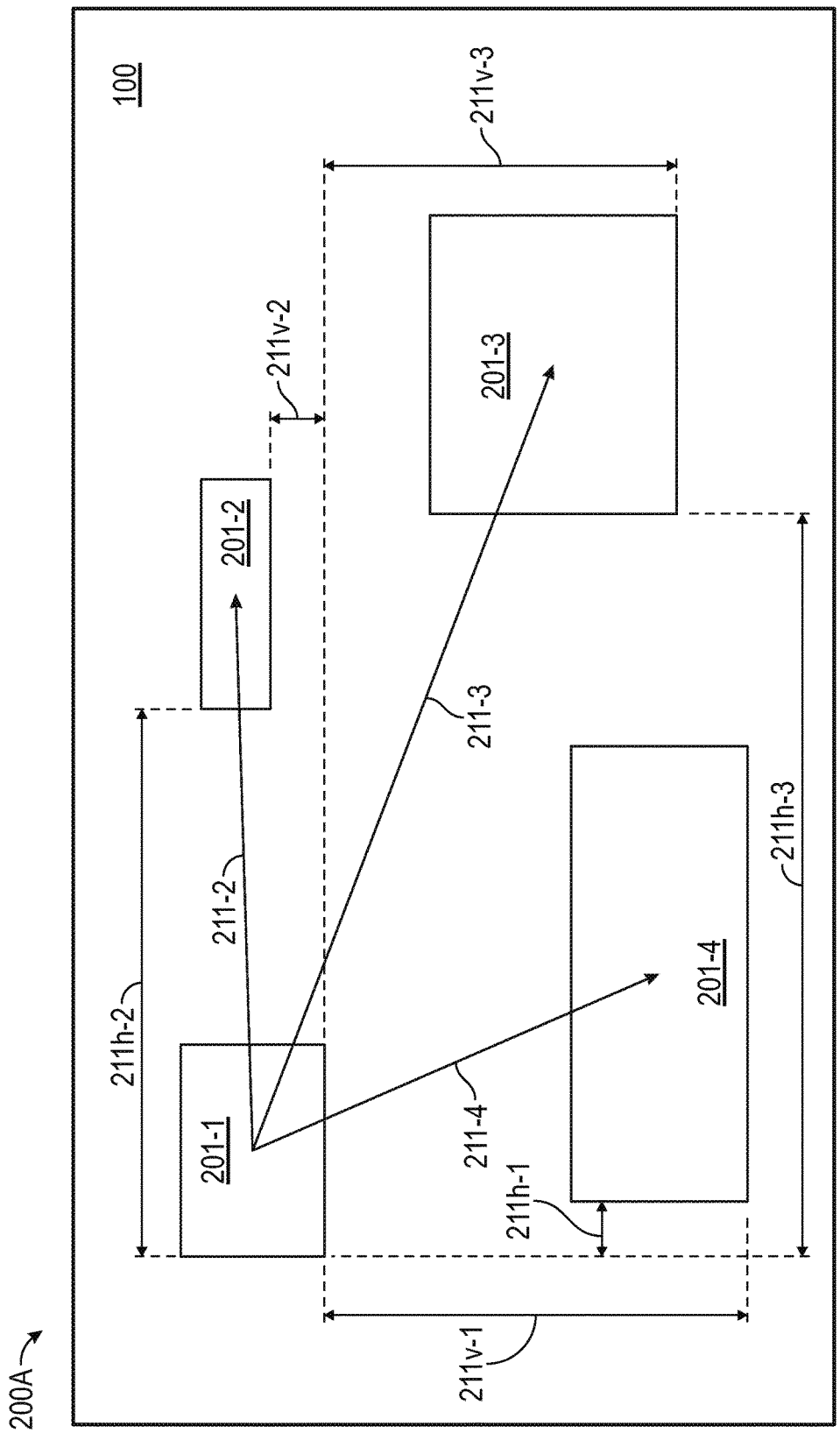
FIG. 2A illustrates relative positions of devices for a circuit layout in a relative configuration, according to some embodiments.

FIG. 2A illustrates relative positions of a plurality of devices 201-1, 201-2, 201-3, and 201-4 (collectively referred to hereinafter as devices 201) for a subset of circuit layout 100 in a relative configuration 200A, according to some embodiments. Without limitation, relative displacements 211-1, 211-2, and 211-3 (hereinafter collectively referred to as displacements 211) between the different devices 201 is determined, in a Cartesian coordinate system, by horizontal displacements 211$h$-1, 211$h$-2, and 211$h$-3 (hereinafter collectively referred to as horizontal displacements 211$h$), and vertical displacements 211$v$-1, 211$v$-2, and 211$v$-3 (hereinafter collectively referred to as vertical displacements 211$v$).

While the exact position of devices 201 is not relevant in relative configuration 200A, their relative positions with one another including horizontal displacements 211$h$ and vertical displacements 211$v$ are considered for placement and routing strategies as disclosed herein. In some embodiments, relative configuration 200A may be provided by a 'placing' tool or engine in a computer system processor.

Figure 2B:
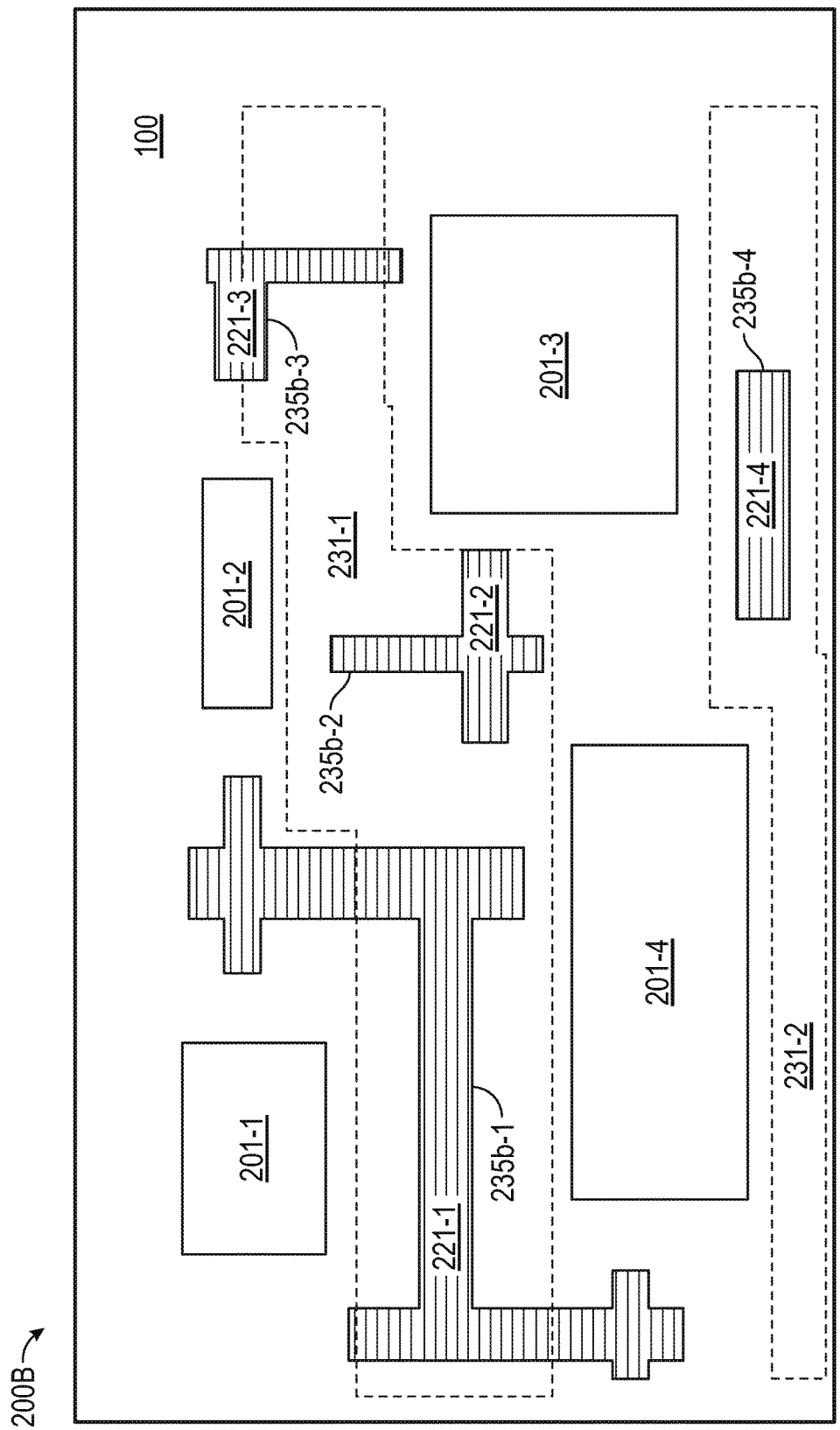
FIG. 2B illustrates routing trunks for a circuit layout in a pre-routing configuration, according to some embodiments.

FIG. 2B illustrates a plurality of routing trunks 221-1, 221-2, 221-3, and 221-4 (hereinafter collectively referred to as routing trunks 221) for circuit layout 100 in a pre-routing configuration 200B. Routing trunks 221 are placed within channels 231-1 and 231-2 (collectively referred to, hereinafter, as channels 231). Without limitation, channels 231-1 and 231-2 are not necessarily straight and horizontally oriented, and may have an irregular shape that straddles through the plurality of devices 201. Moreover, in some embodiments at least one of channels 231 may be disposed partially or completely overlapping a device when the routing trunks 221 in at least one of channels 231 are in a layer that is permitted to run over the device without causing a design rule error (the layer disposed along the depth of FIG. 2B). Each of routing trunks 221 has a selected pre-routing form (e.g., shape and size), and occupies a position on circuit layout 100; trunk 221-1 has a pre-routing form and a position 235$b$-1, trunk 221-2 has a pre-routing form and position 235$b$-2, trunk 221-3 has a pre-routing form and position 235$b$-3, trunk 221-4 has a pre-routing form and position 235$b$-4. Pre-routing form and positions 235$b$-1, 235$b$-2, 235$b$-3, and 235$b$-4 (hereinafter collectively referred to as pre-routing forms and positions 235$b$) are determined during a step including pre-routing, through the plurality of channels 231 in circuit layout 200B, routing trunks 221, according to some embodiments.

In some embodiments, the step of pre-routing routing trunks 221 through channels 231 leading to pre-routing configuration 200B may be followed by a step for determining a routing trunk information for each one of routing trunks 221. For example, the routing trunk information may include values for certain routing trunk parameters given the configuration of circuit layout 200B. The routing trunk parameters may include EM and SHE. In some embodiments, pre-routing configuration 200B may be provided by a 'routing' tool or engine in a computer system processor.

Figure 2C:
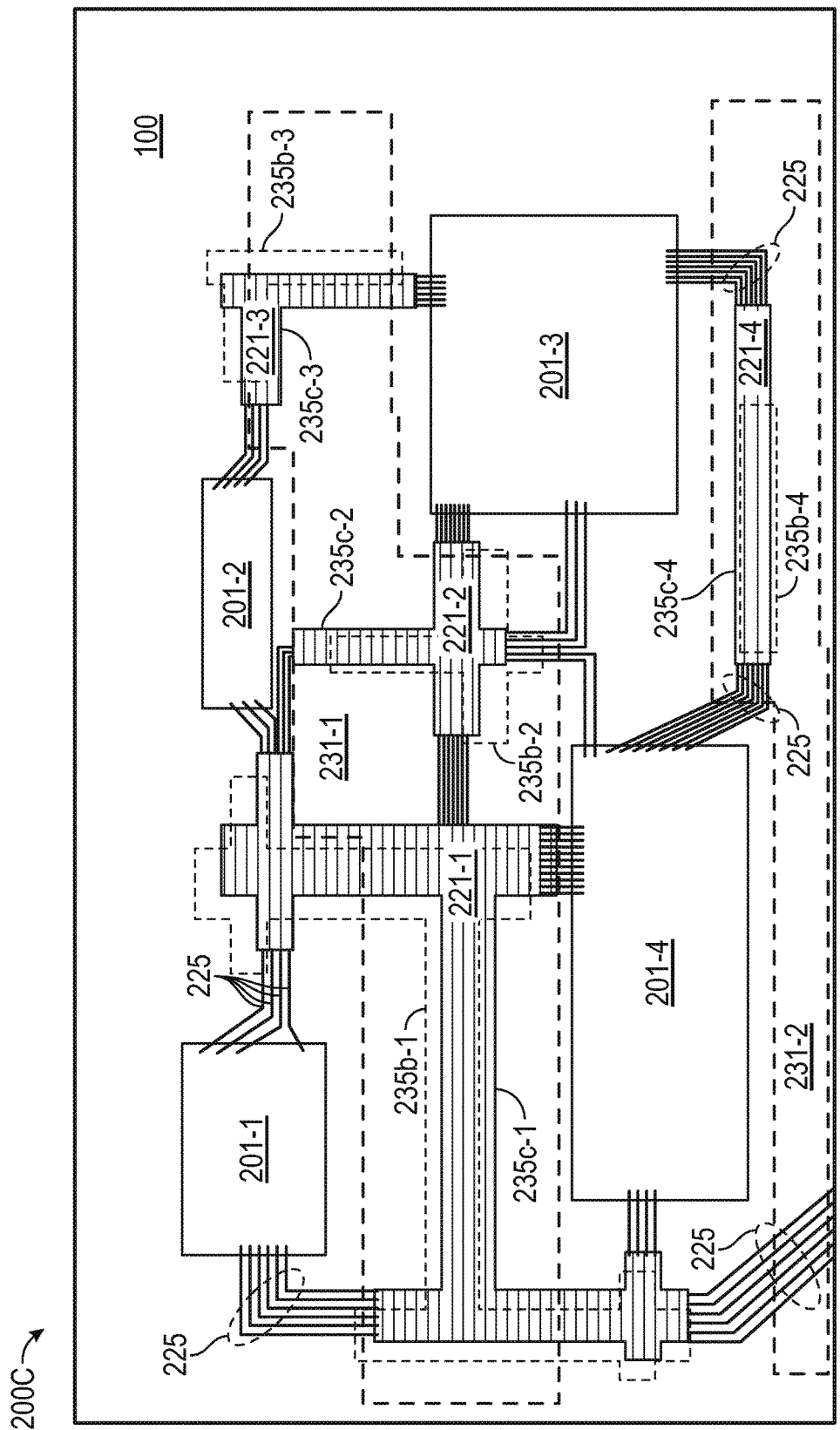
FIG. 2C illustrates the devices of FIG. 2A and the routing trunks of FIG. 2B disposed for a circuit layout in a placement configuration, according to some embodiments.

FIG. 2C illustrates the plurality of devices 201 and the plurality of routing trunks 221 disposed in a placement configuration 200C for circuit layout 100, according to some embodiments. In placement configuration 200C, routing trunks 221-1 through 221-4 have placement forms and positions 235$c$-1 through 235$c$-4 (collectively referred hereinafter to as placement forms and positions 235$c$), respectively. Placement configuration 200C may differ from pre-routing configuration 200B in that pre-routing forms and positions 235$b$ may be slightly modified to placement form and positions 235$c$, based on the routing trunk information collected from pre-routing configuration 200B.

In addition, placement configuration 200C may differ from pre-layout configuration 200B in that the relative positions 211 between devices 201 may be slightly modified, and the absolute positions of devices 201 may be slightly modified.

Accordingly, placement configuration 200C is obtained after placing devices 201 in circuit layout 100, forming routing trunks 221 in their respective placement forms and positions 235$c$. Moreover, routing trunks 221 are coupled to devices 201 through twig routing 225. Some embodiments include, once placement configuration 200C is put in place, a step for checking that the placement of devices 201 and their coupling to routing trunks 221 meet a circuit layout specification. In some embodiments, placement configuration 200C may be provided by the 'placing' tool or engine and the 'routing tool or engine' in a computer system processor. A placing tool can change the relative location of devices automatically based on a user input or an automated algorithm. Similarly, a routing tool can automatically create coupling between devices and their trunks.

Figure 3:
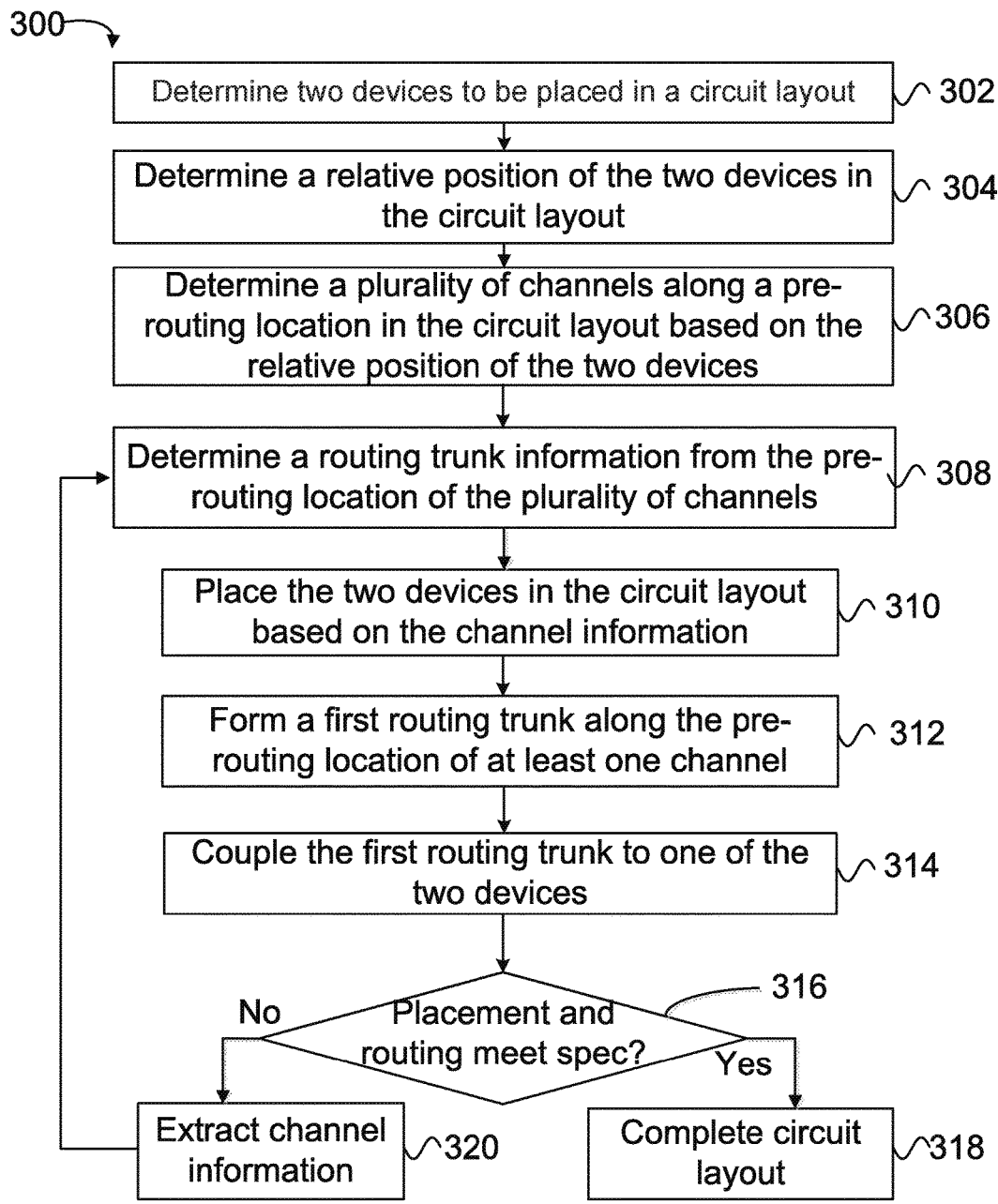
FIG. 3 illustrates a flow chart including steps in a method for placing devices and channels in a circuit layout with a pre-routing step, according to some embodiments.

FIG. 3 illustrates a flow chart including steps in a method 300 for placing a plurality of devices and a plurality of channels in a circuit layout, according to some embodiments. The circuit layout may include devices, coupled through twig routings from routing trunks along channels, and include a heat sink structure (e.g., circuit layout 100, routing trunks 121, twig routings 125, channels 131, and heat sink structure 151).

Methods consistent with the present disclosure may include at least some, but not all of the steps illustrated in method 300, performed in a different sequence. Furthermore, methods consistent with the present disclosure may include at least two or more steps as in method 300 performed overlapping in time, or almost simultaneously. In some embodiments, a user may manually iterate between at least some of the steps in method 300. In some embodiments, a computer system may perform different steps in method 300 using a processor having specialized placing tools and routing tools concatenated together to form a flow as illustrated in method 300.

Step 302 includes determining two devices to be placed in a circuit layout. In some embodiments, step 302 includes determining more than two devices to be placed in a circuit layout. In some embodiments step 302 may include selecting the form and location of a heat sink structure.

Step 304 includes determining a relative position of the two devices in the circuit layout. In some embodiments, step 304 may include placing the two devices in the circuit layout with regard to a relative position between the two devices. In some embodiments, step 304 includes retrieving routing trunk information to accurately determine how much space to leave as empty areas so that routing will complete successfully.

Step 306 includes determining a plurality of channels along a pre-routing location in the circuit layout based on the relative position of the two devices. In some embodiments, step 306 may include selecting the form and location of the channels in the circuit layout. For example, in some embodiments the form and location of a channel may be selected to mitigate an EM or an SHE effect in view of the devices to be placed in the circuit layout. In some embodiments, step 306 includes determining detailed relative form and location of the routing trunks within the channels. In some embodiments, step 306 may be performed nearly instantaneously since only relative positions between few devices are involved, rather than within the entire circuit layout.

In some embodiments, step 304 and step 306 include the decomposition of monolithic 'placing' and 'routing' tools from traditional design tools, allowing pre-routing information to be injected into the flow at the point where it is most effective.

Step 308 includes determining routing trunk information from the pre-routing location of the channels. In some embodiments, step 308 includes extracting and simulating at least one of the advanced node effects in the circuit layout, including effects such as EM and SHE. Accordingly, step 308 may provide a broad picture of the effects the final circuit layout may be subject to at an early stage, which may simplify the complexity of iteration cycles further along the process flow in method 300. In some embodiments, step 308 includes incorporating information regarding EM and SHE and other routing trunk information into the design flow, thus making the routing portion of the placement more likely to succeed. Using the information from these simulations, the relative placement of devices can be used to achieve an actual placement of devices with appropriate channels between the devices to account for the routing trunks. In configurations where the majority of the routing requirements involve forming a proper channel, step 308 significantly reduces the complexity of circuit design.

Step 310 includes placing the two devices in the circuit layout based on the routing trunk information. In some embodiments, step 310 may include using the placing tool in the computer system processor. Step 312 includes forming at least a first routing trunk along the pre-routing location of at least one channel. The form and location of the routing trunk may already be determined with the routing trunk information provided in step 308. Accordingly, in some embodiments steps 310 and 312 may meet design rules and circuit layout specifications only after a few, or even no iterations.

Step 314 includes coupling the first routing trunk to one of the two devices through at least one twig routing. In some embodiments, the routing tool in the computer system processor is used to couple the trunks to the devices.

Step 316 includes checking whether the placement of the at least two devices and the coupling of the first routing trunk meet a circuit layout specification. When the devices are placed and the routing trunk is routed in the final circuit layout, step 316 may include extracting and simulating the circuit performance. Since the majority of the effects are accounted for earlier in the flow, the resulting circuit layout in step 316 is expectedly close to, and more likely to meet, the desired specification as compared to traditional design tools.

When the placement of the two devices and the coupling of the first routing trunk meet a circuit layout specification, step 318 includes completing the circuit layout. In some embodiments, completing the circuit layout may include forming more routing trunks in addition to the first routing trunk. Also, step 318 may include coupling the devices to the routing trunks through twig routings and checking that the placement of the devices and the coupling of the routing trunks meet circuit layout specifications.

When the placement of the two devices and the coupling of the first routing trunk do not meet a circuit layout specification, step 320 includes extracting routing trunk information from the placement of the devices and the first routing trunk in the circuit layout. In some embodiments, step 320 may include repeating steps 304 through 314 for a number of iterations until the circuit layout specifications are met. Even when iterations are performed, the number of iterations cycles before meeting circuit layout specifications may be substantially lower than for traditional design tools.

Some embodiments of method 300 break the 'place' (step 310) and 'route' (step 312) steps into smaller portions of the circuit layout resulting in fewer or no iteration cycles needed for the entire circuit layout in step 320. Accordingly, embodiments consistent with the present disclosure include fewer and faster iteration cycles by reducing the number of places in the circuit layout where iteration would be required. Further, some embodiments allow extraction information to be used earlier in the flow instead of at the end, where traditional design tools perform large, lengthy iterations before the circuit layout complies with performance specifications.

Step 320 is expected to converge in fewer iterations than traditional design tools. Furthermore, each iteration in step 320 is also faster, as placement and routing steps 304 through 314 include smaller portions of the circuit layout. In some embodiments, the iterations in step 320 are performed once different portions of the entire circuit layout have been processed according to steps 304 through 314. Thus, each iterations in step 320 may consider the different portions of the circuit layout at the same time.

Figure 4:
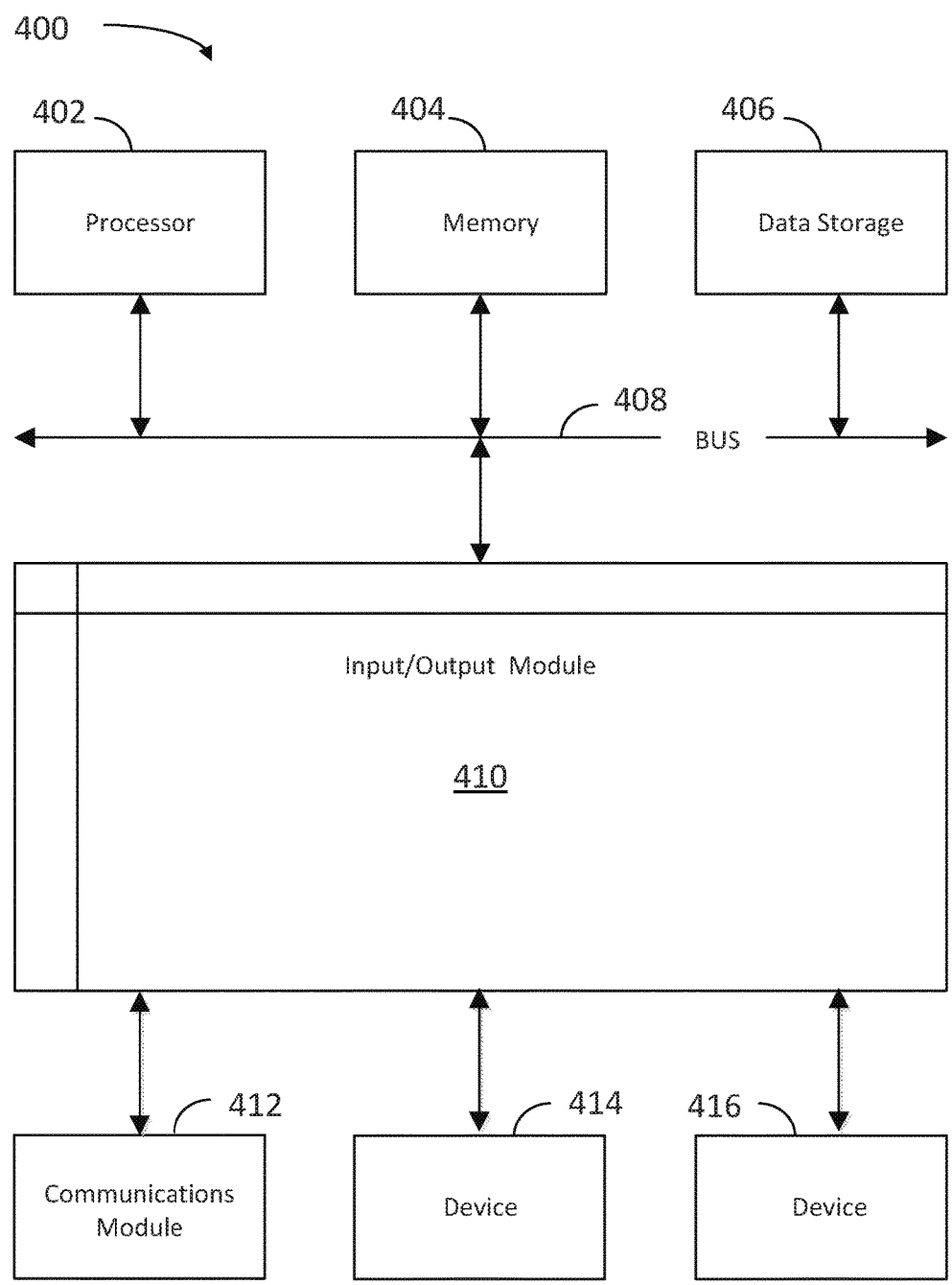
FIG. 4 is a block diagram illustrating an example computer system that includes a design tool, according to some embodiments.

FIG. 4 is a block diagram illustrating an example computer system 400 with which the methods and steps illustrated in FIGS. 1-3 can be implemented, according to some embodiments. In certain aspects, computer system 400 can be implemented using hardware or a combination of software and hardware, either in a dedicated server, integrated into another entity, or distributed across multiple entities.

Computer system 400 includes a bus 408 or other communication mechanism for communicating information, and a processor 402 coupled with bus 408 for processing information. By way of example, computer system 400 can be implemented with one or more processors 402. Processor 402 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. In some embodiments, processor 402 may include modules and circuits configured as a 'placing' tool or engine, or a 'routing' tool or engine, to place devices and route channels in a circuit layout, respectively and as disclosed herein.

Computer system 400 includes, in addition to hardware, code that creates an execution environment for the computer program in question. e.g., code that constitutes processor firmware, a protocol stack, a database management system, an operating system, or a combination of one or more of them stored in an included memory 404, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 408 for storing information and instructions to be executed by processor 402. Processor 402 and memory 404 can be supplemented by, or incorporated in, special purpose logic circuitry.

The instructions may be stored in memory 404 and implemented in one or more computer program products, e.g., one or more modules of computer program instructions encoded on a computer readable medium for execution by, or to control the operation of, the computer system 400.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network, such as in a cloud-computing environment. The processes and logic flows described in this specification can be performed by one or more programmable processors executing one or more computer programs to perform functions by operating on input data and generating output.

Computer system 400 further includes a data storage device 406 such as a magnetic disk or optical disk, coupled to bus 408 for storing information and instructions.

Computer system 400 is coupled via input/output module 410 to various devices. The input/output module 410 is any input-output module. Example input/output modules 410 include data ports such as USB ports. The input/output module 410 is configured to connect to a communications module 412. Example communications modules 412 include networking interface cards, such as Ethernet cards and modems. In certain aspects, the input/output module 410 is configured to connect to a plurality of devices, such as an input device 414 and/or an output device 416. Example input devices 414 include a keyboard and a pointing device, e.g., a mouse or a trackball, by which a user can provide input to the computer system 400. Other kinds of input devices 414 are used to provide for interaction with a user as well, such as a tactile input device, visual input device, audio input device, or brain-computer interface device.

Methods as disclosed herein may be performed by computer system 400 in response to processor 402 executing one or more sequences of one or more instructions contained in memory 404. Such instructions may be read into memory 404 from another machine-readable medium, such as data storage device 406. Execution of the sequences of instructions contained in main memory 404 causes processor 402 to perform the process steps described herein (e.g., as in method 300). One or more processors in a multi-processing arrangement may also be employed to execute the sequences of instructions contained in memory 404. Processor 402 may process the executable instructions and/or data structures by remotely accessing the computer program product, for example by downloading the executable instructions and/or data structures from a remote server through communications module 412 (e.g., as in a cloud-computing environment). In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. For example, some aspects of the subject matter described in this specification may be performed on a cloud-computing environment. Accordingly, in certain aspects a user of systems and methods as disclosed herein may perform at least some of the steps by accessing a cloud server through a network connection. Further, data files, circuit diagrams, performance specifications and the like resulting from the disclosure may be stored in a database server in the cloud-computing environment, or may be downloaded to a private storage device from the cloud-computing environment.

The term "machine-readable storage medium" or "computer readable medium" as used herein refers to any medium or media that participates in providing instructions or data to processor 402 for execution. Such a medium may take many forms, including, but not limited to, non-volatile media, volatile media, and transmission media.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To the extent that the term "include," "have," or the like is used in the description or the claims, such term is intended to be inclusive in a manner similar to the term "comprise" as "comprise" is interpreted when employed as a transitional word in a claim.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

The invention claimed is:

1. A computer-implemented method for placing and routing devices in a circuit layout, the computer-implemented method comprising:
   determining two devices to be placed in a circuit layout;
   determining a relative position of the two devices in the circuit layout;
   routing a plurality of channels along a pre-routing location in the circuit layout based on the relative position of the two devices;
   determining routing trunk information from the pre-routing location of the plurality of channels;
   placing the two devices in the circuit layout based on the routing trunk information;
   forming a first routing trunk along the pre-routing location of at least one channel of the plurality of channels;
   coupling the first routing trunk to one device of the two devices; and
   checking that the two devices and the first routing trunk meet a circuit layout specification.

2. The computer-implemented method of claim 1, further comprising extracting the routing trunk information from a first device location and a second device location of the two devices and from the pre-routing location of the first routing trunk to modify at least one of the first device location, the second device location, and the pre-routing location when the circuit layout specification is not met.

3. The computer-implemented method of claim 1, further comprising:
completing the circuit layout by placing a plurality of devices including the two devices and at least a third device in a plurality of device locations;
forming a plurality of routing trunks including the first routing trunk in a plurality of pre-routing locations;
coupling the plurality of devices to the plurality of routing trunks; and
checking that the plurality of devices and the plurality of routing trunks meet the circuit layout specification.

4. The computer-implemented method of claim 1, wherein the routing a plurality of channels along a pre-routing location comprises selecting a form and a location of an empty area in the circuit layout.

5. The computer-implemented method of claim 1, wherein the determining the routing trunk information from the pre-routing location of the plurality of channels comprises determining at least one of an electromigration effect and a self-heating effect based on a current density in the plurality of channels.

6. The computer-implemented method of claim 1, wherein the forming a first routing trunk along the pre-routing location of at least one of the plurality of channels comprises selecting a size and a shape of the first routing trunk in an empty area between the two devices.

7. The computer-implemented method of claim 1, further comprising modifying a form and a location of the first routing trunk when the two devices and the first routing trunk do not meet the circuit layout specification.

8. The computer-implemented method of claim 1, further comprising modifying the relative position of the two devices when the two devices and the first routing trunk do not meet the circuit layout specification.

9. The computer-implemented method of claim 1, further comprising iterating the placing the two devices in the circuit layout and the forming a first routing trunk along the pre-routing location of at least one of the plurality of channels, until the circuit layout specification is met.

10. A system, comprising:
a memory for storing computer code; and
a processor that executes the computer code to:
determine two devices to be placed in a circuit layout;
determine a relative position of the two devices in the circuit layout;
route a plurality of channels along a pre-routing location in the circuit layout based on the relative position of the two devices;
determine routing trunk information from the pre-routing location of the plurality of channels;
place the two devices in the circuit layout based on the routing trunk information;
form a first routing trunk along the pre-routing location of at least one channel of the plurality of channels;
couple the first routing trunk to one device of the two devices;
check that the two devices and the first routing trunk meet a circuit layout specification; and
select a form and a location of an empty area in the circuit layout.

11. The system of claim 10, wherein the processor further executes commands to extract routing trunk information from a first device location and a second device location of the two devices and from the pre-routing location of the first routing trunk, to modify at least one of the first device location, the second device location, and the pre-routing location, when the circuit layout specification is not met.

12. The system of claim 10, wherein the processor further executes commands to:
complete the circuit layout by placing a plurality of devices including the two devices and at least a third device in a plurality of device locations;
form a plurality of routing trunks including the first routing trunk in a plurality of pre-routing locations;
couple the plurality of devices to the plurality of routing trunks; and
check that the plurality of devices and the plurality of routing trunks meet the circuit layout specification.

13. The system of claim 10, wherein the processor further executes commands to determine at least one of an electromigration effect and a self-heating effect based on a current density in the plurality of channels.

14. The system of claim 10, wherein the processor further executes commands to select a size and a shape of the first routing trunk in an empty area between the two devices.

15. A non-transitory, machine-readable storage medium comprising machine-readable instructions for causing a processor to execute a method for placing and routing devices in a circuit layout, the method comprising:
determining two devices to be placed in a circuit layout;
determining a relative position of the two devices in the circuit layout;
routing a plurality of channels along a pre-routing location in the circuit layout based on the relative position of the two devices;
determining routing trunk information from the pre-routing location of the plurality of channels;
placing the two devices in the circuit layout based on the routing trunk information;
forming a first routing trunk along the pre-routing location of at least one channel of the plurality of channels;
coupling the first routing trunk to one device of the two devices;
checking that the two devices and the first routing trunk meet a circuit layout specification; and
selecting a form and a location of an empty area in the circuit layout.

16. The non-transitory, machine-readable medium of claim 15, wherein the method further comprises extracting the routing trunk information from a first device location and a second device location of the two devices and from the pre-routing location of the first routing trunk, to modify at least one of the first device location, the second device location, and the pre-routing location, when the circuit layout specification is not met.

17. The non-transitory, machine-readable medium of claim 15, wherein the method further comprises:
completing the circuit layout by placing a plurality of devices including the two devices and at least a third device in a plurality of device locations;
forming a plurality of routing trunks including the first routing trunk in a plurality of pre-routing locations;
coupling the plurality of devices to the plurality of routing trunks; and
checking that the plurality of devices and the plurality of routing trunks meet the circuit layout specification.

18. The non-transitory, machine-readable medium of claim 15, wherein the method further comprises determining at least one of an electromigration effect and a self-heating effect based on a current density in the plurality of channels.

19. The non-transitory, machine-readable medium of claim 15, wherein the method further comprises selecting a size and a shape of the first routing trunk in an empty area between the two devices.

20. The non-transitory, machine-readable medium of claim 15, wherein the method further comprises modifying a form and a location of the first routing trunk when the two devices and the first routing trunk do not meet the circuit layout specification.

* * * * *